United States Patent [19]
Garland

[11] Patent Number: 4,718,271
[45] Date of Patent: Jan. 12, 1988

[54] LOCOMOTIVE LINE TESTER

[76] Inventor: John L. Garland, Rte. 8, Box 141 A, Corbin, Ky. 40701

[21] Appl. No.: 936,234

[22] Filed: Dec. 1, 1986

[51] Int. Cl.⁴ .............................................. G01M 15/00
[52] U.S. Cl. ...................................... 73/116; 340/52 F
[58] Field of Search ............... 318/490, 650; 180/14.1; 73/116, 117.3; 324/158 MG; 340/52 F, 635, 815.03

[56] References Cited

U.S. PATENT DOCUMENTS 4,656,586  4/1987  Ochiai et al. ................... 73/117.3 X

FOREIGN PATENT DOCUMENTS 767903  9/1980  U.S.S.R. ...................... 324/158 MG

*Primary Examiner*—Jerry W. Myracle
*Attorney, Agent, or Firm*—Burns, Doane, Swecker & Mathis

[57] ABSTRACT

A portable device, used in the field, for checking various functions of a locomotive control system between service intervals. The device has a standard Association of American Railroads (AAR) terminal configuration which can be mated with the control cable of the locomotive under test. The locomotive controls are selectively operated and the device is equipped with LEDs which give a go/no-go indication of the proper operation of the various controls including control of the one through eight throttle positions, dynamic braking and the sander.

9 Claims, 7 Drawing Figures

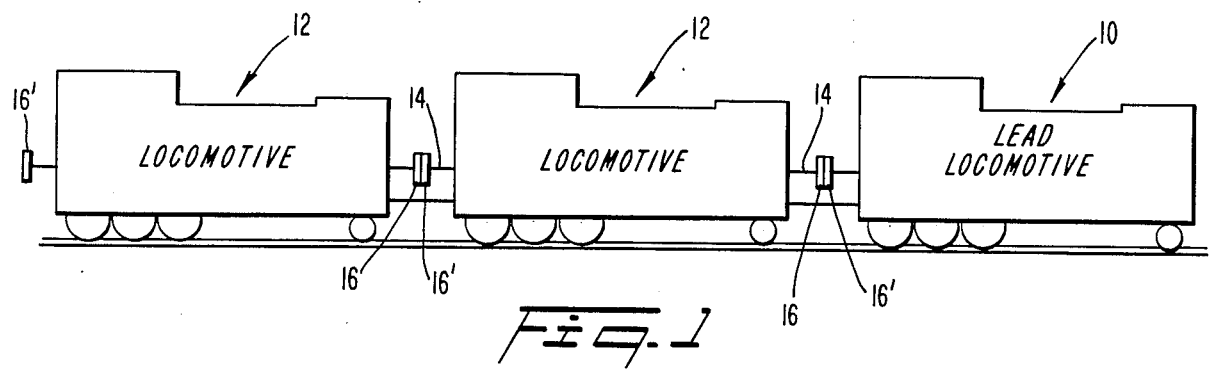
Fig. 1
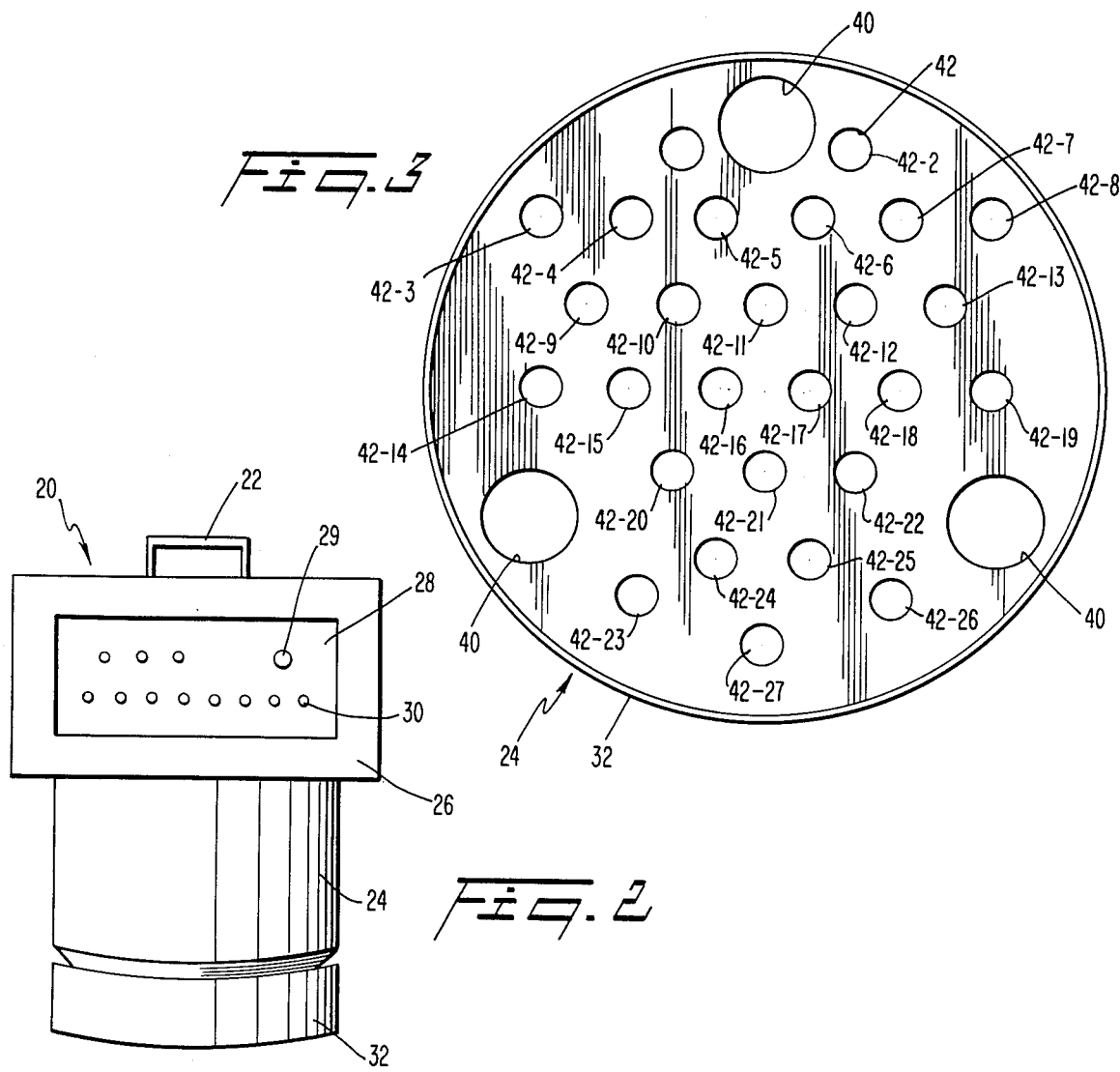
Fig. 3
Fig. 2

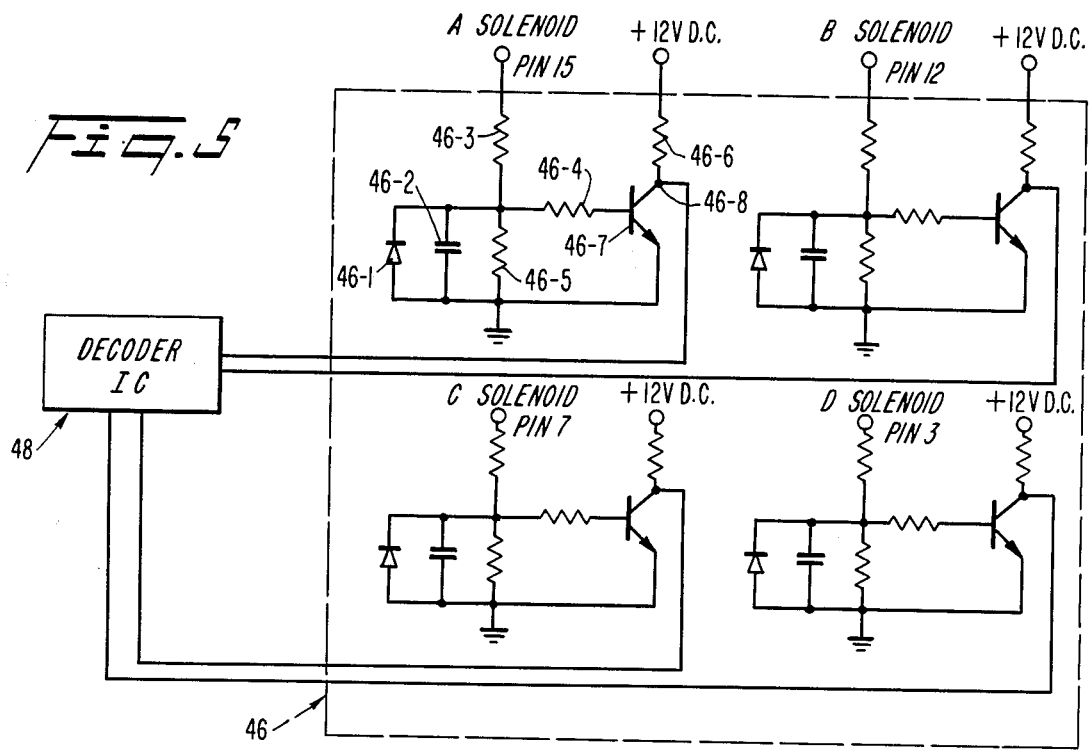
Fig. 5
| THROTTLE POSITION | VALVE COMBINATIONS |
|---|---|
| 2 | A |
| 3 | C |
| 4 | A, C |
| 5 | B, C, D |
| 6 | A, B, C, D |
| 7 | B, C |
| 8 | A, B, C |
Fig. 6
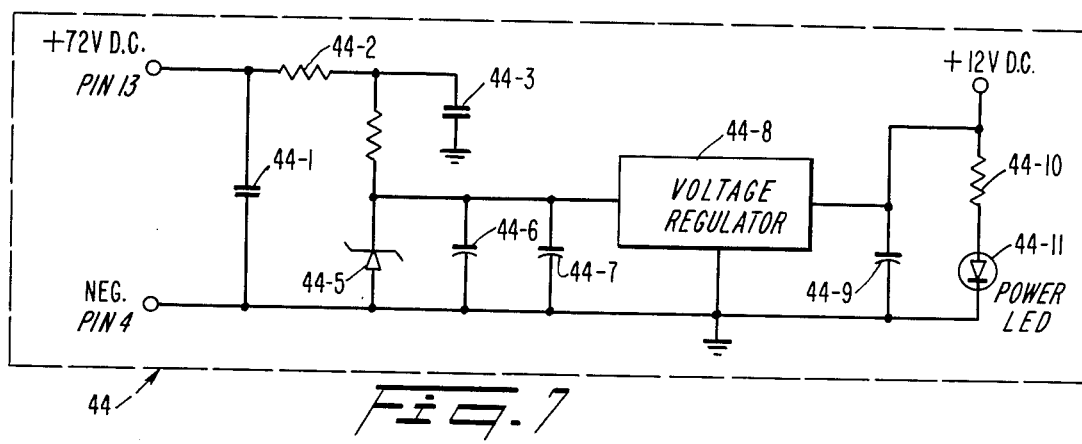
Fig. 7

LOCOMOTIVE LINE TESTER

BACKGROUND OF THE INVENTION

The present invention relates to an indicating apparatus for testing such functions as dynamic braking, sanding, and the throttle positions of a locomotive, and in particular to an apparatus of this type which is portable and can be easily carried to the field.

Every sixty to ninety days, as required by many companies, a locomotive is thoroughly tested. The control system and the control cable of each locomotive are tested among other things. Cable connectors are provided at the end of each locomotive to provide control over the locomotives by linking the control cable from the lead locomotive to each successive locomotive. The train being tested, must be removed to a testing area where each locomotive is disconnected and tested individually by a large machine. This is a very time consuming process. If a breakdown were to occur in the field during operation, the train would have to be removed from operation and wait to be tested. Alternatively, an operator can try to manually troubleshoot the system in the field using crude techniques including alligator clips and a current meter. This approach also proves to be very time consuming.

Some of the functions being controlled by the locomotive are dynamic braking, sanding and the throttle position of the train. Typically, the train is capable of being operated at one of eight throttle positions. The functions listed above are critical to the proper operation of the train and it is important that they be checked frequently.

OBJECTS AND BRIEF SUMMARY OF THE INVENTION

It is a general object of the invention to provide a locomotive control system line tester which saves time in testing the control system.

It is a specific object of the invention to provide a locomotive control system line tester which is lightweight, portable, and therefore easy to carry by hand to the field.

It is another specific object of the invention to provide a locomotive control system line tester which has a connector configuration which mates with the cable connector of each locomotive of the train and allows the testing of each locomotive separately without removing the train from service and without disconnecting each locomotive from the train.

The present invention relates to a line testing apparatus for testing the control system of a locomotive. The system provides control of dynamic braking, traction sanding, the eight throttle positions of the locomotive engine, as well as other control functions. The line testing apparatus is portable and is provided with a coupler for mating with the cable connectors of any of the several locomotives to be tested. The coupler has a termination configuration which is compatible with the cable termination of the locomotive control system and provides for quick testing of the locomotive control system and the cable lines of each locomotive being controlled by the lead locomotive. The control cable connectors have pins, for carrying the various signals from the control system, which can be electrically connected to the line tester which has corresponding pin holes. The line tester indicates the status of the various control signals and comprises a housing, a display connected to the housing and circuitry in the housing for connecting the various control lines from a cable coupler to the display board. The display board includes means for indicating the status of the various control signals. A coupler is attached between the housing and a rubber boot and includes pin holes corresponding to the pins of the control cable connector.

BRIEF DESCRIPTION OF THE DRAWINGS

The objects, advantages and features of the present invention will become apparent from the following detailed description of the preferred embodiment, when read with reference to the accompanying drawings, in which:

FIG. 1 is a side view of a lead locomotive followed by two locomotives of the train with the control cable interconnected between the locomotives;

FIG. 2 is a front view of the line tester used to check the control system of a locomotive;

FIG. 3 is a bottom view of the line tester of FIG. 2 showing the pin holes to be mated with the control cable connector;

FIG. 5 is the circuitry of the coupling circuit of FIG. 4;

FIG. 6 is a table of the solenoid combinations needed for the different throttle positions; and FIG. 7 is the circuitry of the voltage regulator of FIG. 4.

DETAILED DESCRIPTION OF THE PREFERRED EMBODIMENT

Figure 4:
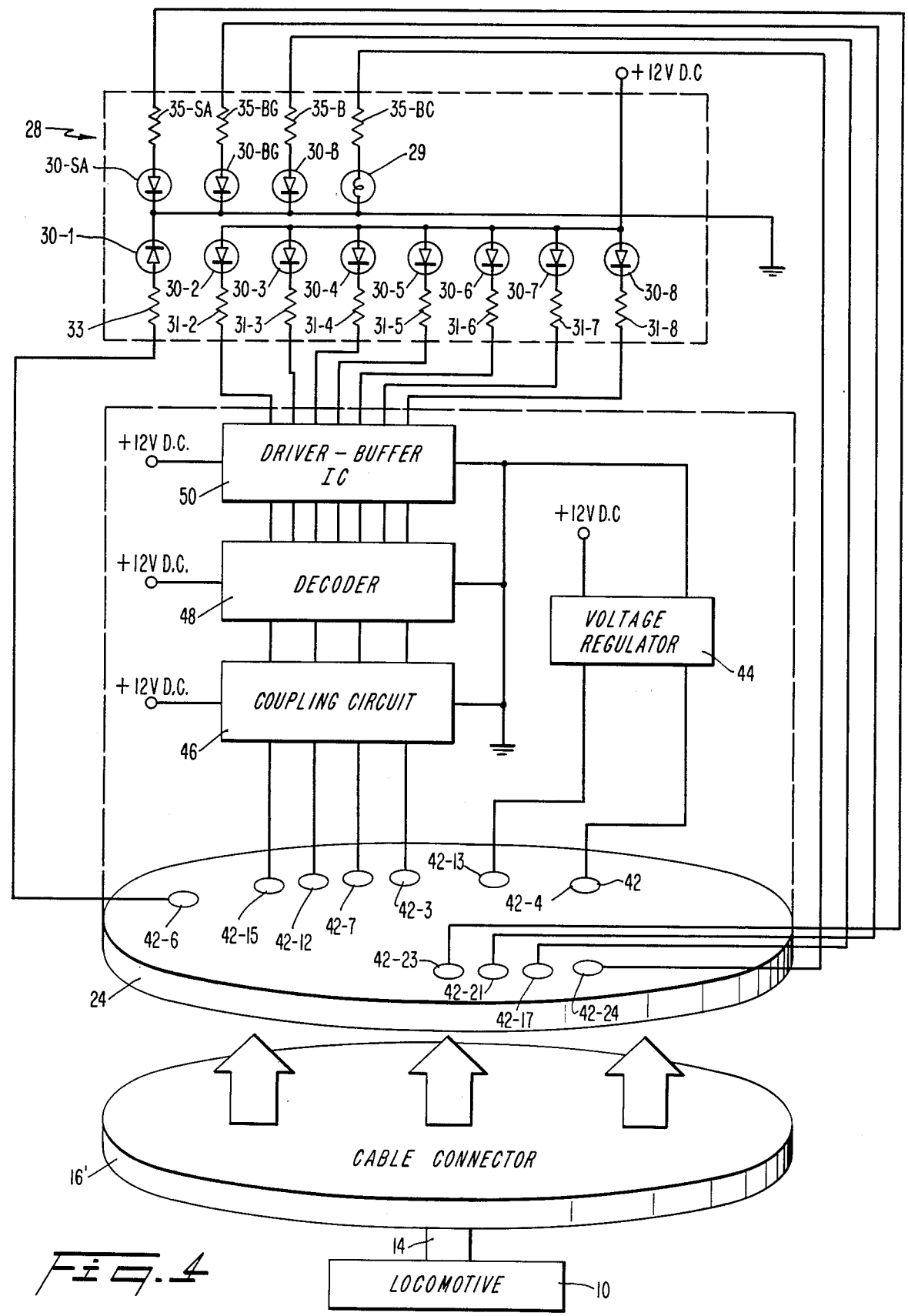
FIG. 4 is a block diagram and a schematic of the interconnections of the pin holes and the display board of the line tester.

With reference to FIG. 1 there is shown a lead locomotive 10 followed by successive locomotives 12. Each locomotive has an electric motor connected to an axle for driving the train. Each locomotive also includes a sander which releases sand when the train is losing traction. The lead locomotive 10 includes a control system for controlling the sander, the motors in the axles, and other operating elements. The motor speeds are controlled through the selection of one of eight throttle positions in the locomotive control system. The system also provides control over dynamic braking of the individual motors of successive locomotives 12. To control the various locomotives in the train a control cable 14 is linked between the lead locomotive 10 and each of the successive locomotives 12. In order to permit the locomotives to be frequently disconnected from one another, a control cable connector 16 is provided at each end of a locomotive for facilitating connection of the control cable 14 to the adjacent locomotive.

As discussed above in the Background of the Invention, to ensure safe operation of the train it is necessary to thoroughly test the locomotives in a shop by a large machine every sixty to ninety days. Each locomotive is disconnected and tested individually. This process is costly and time consuming. Typically a cable connector 16 or the cable 14 itself will deteriorate, thus creating a bad connection. If this occurs in the middle of a long train line a great deal of time could be needed to manually check several locomotives until the defective one is located. Accordingly, it is necessary to test the connections in the field between service intervals. However, there previously has been no method of testing the control system in the field except by manually checking the various control signals in the cable line. This was done by painstakingly connecting alligator clips to each of the pins in the control cable connectors 16 and measuring a response when a control function is performed in the locomotive.

FIG. 2 shows a portable line tester 20 which is lightweight and can be easily carried to the field by a handle 22. The portable line tester 20 tests the control system and the control cable connections of a lead locomotive and the successive locomotives of a train. The line tester 20 has a coupler 24 on which is mounted a housing 26 with a display board 28. The coupler 24 can be mated with the cable connectors 16' of a control cable. The coupler 24 has a rubber boot 32 on its mating end which fits snugly over the cable connector 16'. The display board 28 has several light emitting diodes (LEDs) 30 and a lamp 29 for indicating the status of the sanding, dynamic braking, and eight throttle position functions of the locomotive control system.

In operation, field tests are performed by connecting the line tester to the cable connector of the rear-most locomotive. An operator operates a control panel in the lead locomotive in order to go through the various control functions. The line tester LEDs 30 and lamp 29 provide go/no-go indications of proper operation of the various functions. The same tests are then performed on the next locomotive and so on until all the locomotives have been tested. These tests can be done quickly and without the need for disconnecting the individual locomotives and removing them from the field. The line test does not completely eliminate the need for complete testing every sixty to ninety days, but it enables one to locate problems in the field very quickly without requiring extensive testing.

FIG. 3 is a bottom view of the coupler of the line tester of FIG. 2. The rubber boot 32 is fit around the circumference of the coupler 24. The coupler has mounting holes 40 for mating with the cable connectors 16' on the train control cable 14 and includes twenty-seven pin holes 42 for mating with corresponding pins on the cable connectors 16' in order to make an electrical connection between the locomotive controls and the line tester. The line tester of the preferred embodiment does not test all of the various control functions, therefore, the 42-1, 42-2, 42-5, 42-8, 42-9, 42-10, 42-11, 42-14, 42-16, 42-18, 42-19, 42-20, 42-22, 42-25, 42-26 and 42-27 pin holes should be filled with silicone. Of course, it will be readily apparent to the skilled practitioner that additional tests could be performed with the line tester of the present invention, in which case additional pins would be used. The pin hole configuration shown in FIG. 3 is standard for the Association of American Railroads (AAR). Only the 42-3, 42-4, 42-6, 42-7, 42-12, 42-13, 42-15, 42-17, 42-21, 42-23 and 42-24 pins are utilized by the preferred embodiment of the line tester.

FIG. 4 shows the interconnections of the cable pin holes 42 and the LEDs 30 on the display board 28, and depicts the mating of the cable connector 16' with the coupler 24. The cable connector 16' is shown being linked through the cable 14 to the locomotive 10. The pin holes 42 which are used by line tester for mating with the cable connector pins are 42-3, 42-4, 42-6, 42-7, 42-12, 42-13, 42-15, 42-17, 42-21, 42-23 and 42-24. The pin 42-6 is directly connected from the locomotive generator field directly to the display board and is connected to the diode 30-1 which indicates a first throttle position. A resistor 33 is connected between the pin 42-6 and the diode 30-1. In the first throttle position the train does not move but electricity is supplied to the motors and they are loaded down. This prepares the locomotive to move out at slow speed.

Throttle positions two through eight correspond to various speeds of operation for the train. The diodes for the second through eighth throttle positions are selectively energized through combinations of signals from the pins 42-15, 42-12, 42-7 and 42-3 of the cable connector. Pins 42-15, 42-12, 42-7, and 42-3 are connected to A, B, C, and D solenoids, respectively, which operate in a conventional manner to control the speed of the locomotive. Different combinations of the A through D solenoids give the second through eighth throttle positions. These combinations are shown in the table of FIG. 6. When a solenoid is "ON", the corresponding pin is at a potential of 72 volts D.C.. Alternatively, when a solenoid is "OFF", the corresponding pin is at the reference potential. The A through D solenoids are connected to coupling circuits 46 which provide signals to the decoder 48 and electric isolation from spikes created by the 72 Volt DC supply from the locomotive. The detailed circuitry for the coupling circuits is shown in FIG. 5.

The circuitry for each of the four coupling circuits is identical thus only one coupling circuit will be described. With reference to the coupling circuit connected to the A solenoid, a diode 46-1 and capacitor 46-2 operate as a filter. Resistors 46-3, 46-4, and 46-5 act as a voltage divider so that the base of transistor 46-7 has a potential of 1 volt when the A solenoid is turned ON. Transistor 46-7 acts as a switch such that when the A solenoid is turned ON the voltage drop across resistor 46-6 is 12 volts and the output at node 46-8 is at ground potential. When the A solenoid is turned off, the transistor switch 46-7 closes and the output at node 46-8 is twelve volts. As an alternative to the above circuitry, an optical coupling circuitry could be used to provide electrical isolation between the solenoids A through D and the input to the decoder IC 48.

The signals from the coupling circuits 46 are then fed to a standard decoder integrated circuit 48 such as a Motorola MC 14514B. The decoder operates in a conventional fashion in response to the four signals from the four coupling circuits to provide seven outputs corresponding to the second through eighth throttle positions. These output signals from the decoder 48 are then fed through a standard driver and buffer integrated circuit 50 such as a ULN 2004A manufactured by Sprague. Resistors 31 are connected between the diodes 30 and the integrated circuits to protect the integrated circuits from spikes. The different solenoid combinations of FIG. 6 can be selectively engaged to light the corresponding diodes 30.

As indicated in FIG. 4, pins 42-13 and 42-4 represent a +72 Volt DC voltage terminal from the locomotive and a reference potential terminal, respectively. The pins 42-13 and 42-4 are used to supply power to a voltage regulator 44. The voltage regulator 44 provides a 12 volt DC output for operating the components of the line tester. The details of the voltage regulator circuit are shown in FIG. 7. A smoothing capacitor 44-1 is provided. A resistor 44-2 and capacitor 44-3 provide suppression of spikes from a 72 Volt DC source at pin 13. A voltage drop resistor 44-4 is connected to a zener diode 44-5 having a breakthrough voltage of 18 Volts. The resistor 44-4 and zener diode 44-5 provide an 18 volt input to a standard voltage regulator integrated circuit 44-8 such as a Motorola 7812. Two smoothing capacitors 44-6 and 44-7 smooth the input to the voltage regulator integrated circuit 44-8 which converts the 18 volt input to 12 volt output in a known manner. The 12 volt output is smoothed by capacitor 44-9. Resistor 44-10 in conjunction with power LED 44-11 provide a "power on" indication.

Referring again to FIG. 4, pin 42-23 is connected directly to the LED 30-SA through a resistor 33-SA. The LED 30-SA lights when the sander control is operated to indicate proper operation. If the LED 30-SA remains unlit during testing of the sanding function, a failure is indicated. The pins 42-21, 42-17 and 42-24 are used to test the dynamic braking control. The diodes 30-BG and 30-B are connected to pins 42-21 and 42-17, respectively, through resistors 35.

A control signal on pin 17 sets up switchgear in each locomotive enabling the locomotive to go into a dynamic braking mode. The switchgear places resistors across the windings of the drive motors in a known manner to load down the motors which then act as generators to retard the train motion. Diode 30-B will light when the correct control signal is sent to pin 17.

A standard locomotive is provided with air brakes in addition to dynamic braking. However, in order to prevent locking of the locomotive wheels, it is necessary to ensure that the air brakes are not engaged during dynamic braking. A signal on pin 21 operates to release the air brakes. Diode 30-BG indicates that a correct control signal has been sent to pin 21.

The amount of dynamic braking in a locomotive is governed by a variable voltage signal on pin 24. The line tester of the preferred embodiment includes a light bulb 29 having one terminal connected with pin 24 and another terminal connected with a ground terminal. The amount of current flowing through light bulb 29 depends upon the value of the control signal on pin 24. Thus, the brightness of the lamp 29 varies with the dynamic braking control signal on pin 24.

The principles, preferred embodiments and modes of operation of the present invention have been described in the foregoing specification. The invention which is intended to be protected herein, however, is not to be construed as being limited to the particular forms disclosed, since these are to be regarded as illustrative rather than restrictive. Variations and changes may be made by those skilled in the art without departing from the spirit of the invention.

What is claimed is:

1. A portable line testing apparatus for testing the control system of a locomotive, which control system provides control of dynamic braking, traction sanding, and throttle positions of the locomotive, wherein cable connectors are provided at one end of a lead locomotive and at each end of successive locomotives operating under control of the lead locomotive to link the lead locomotive control system to the several locomotives to be controlled, and wherein the control cable connectors have pins for carrying the various control signals, said apparatus comprising:
  a housing;
  a display board, connected to said housing;
  a coupler having a first end connected to said housing and including pin holes on a second end opposite said first end, said pin holes corresponding to the pins of the control cable;
  means in said housing for connecting the various control pins from a cable coupler to the display board;
  indicating means on said display board for indicating the status of the various control signals.

2. An apparatus as recited in claim 1, further comprising a rubber boot connected to said coupler on said second end.

3. An apparatus as recited in claim 1, wherein said indicating means on said display board includes eight light-emitting diodes for indicating the correct operation of the controls for eight throttle positions, a light-emitting diode for indicating proper operation of the sanding control, and first and second braking indicator light-emitting diodes and a light bulb for indicating proper operation of the dynamic braking controls.

4. The apparatus as recited in claim 3, wherein said connecting means includes:
  a plurality of coupling circuits, each coupling circuit having an input connected with a respective pin which carries a throttle control signal, wherein different combinations of throttle control signals indicate different throttle positions, each of said coupling circuits providing an output signal in response to the throttle control signal at the respective pin;
  decoder means for receiving said output signals from said coupling circuits and including a plurality of output lines, each output line corresponding to an individual throttle position, said decoder means providing a decoder output signal on an output line corresponding to the selected throttle position;
  means connected with said output lines of said decoder for driving light-emitting diodes, each output line having a corresponding light-emitting diode.

5. An apparatus as recited in claim 4, wherein said connecting means further includes a resistor connected in series with each of said light-emitting diodes.

6. An apparatus as recited in claim 4, and further including voltage regulator means for powering the line testing device.

7. An apparatus as recited in claim 1, wherein said connecting means includes:
  a plurality of coupling circuits, each coupling circuit having an input connected with a respective pin which carries a throttle control signal, wherein different combinations of throttle control signals indicate different throttle positions, each of said coupling circuits providing an output signal in response to the throttle control signal at the respective pin;
  decoder means for receiving said output signals from said coupling circuits and including a plurality of output lines, each output line corresponding to an individual throttle position, said decoder means providing a decoder output signal on an output line corresponding to the selected throttle position;
  means connected with said output lines of said decoder for driving light-emitting diodes, each output line having a corresponding light-emitting diode.

8. An apparatus as recited in claim 7, wherein said connecting means further includes a resistor connected in series with each of said light-emitting diodes.

9. An apparatus as recited in claim 1, and further including voltage regulator means for powering the line testing device.

* * * * *